(12) United States Patent
Cusac et al.

(10) Patent No.: US 6,634,619 B2
(45) Date of Patent: Oct. 21, 2003

(54) PRESSURE CONTROL VALVE HAVING ENHANCED DURABILITY

(75) Inventors: David A. Cusac, East Peoria, IL (US); Chuong Q. Dam, San Jose, CA (US); Mark G. Fulford, Peoria, IL (US); Paul A. Gamble, Peoria, IL (US); Robert E. Hawbaker, Peoria, IL (US); Rebecca M. Zick, Chillicothe, IL (US)

(73) Assignee: Caterpillar Inc, Peoria, IL (US)

( * ) Notice: Subject to any disclaimer, the term of this patent is extended or adjusted under 35 U.S.C. 154(b) by 6 days.

(21) Appl. No.: 09/843,268

(22) Filed: Apr. 26, 2001

(65) Prior Publication Data

US 2002/0000247 A1 Jan. 3, 2002

Related U.S. Application Data

(63) Continuation-in-part of application No. 09/213,710, filed on Dec. 17, 1998.
(60) Provisional application No. 60/101,382, filed on Sep. 21, 1998.

(51) Int. Cl.[7] ................................................. F16K 5/00
(52) U.S. Cl. ..................... 251/368; 123/188.3; 123/446
(58) Field of Search ....................... 251/368; 123/188.3, 123/446

(56) References Cited

U.S. PATENT DOCUMENTS

| | | |
|---|---|---|
| 1,275,456 A | 8/1918 | Maher |
| 4,370,854 A | 2/1983 | Williams |
| 4,426,162 A | 1/1984 | Tsuchiya et al. |
| 4,643,740 A | 2/1987 | Nicolson |
| 4,875,658 A * | 10/1989 | Asai ...................... 251/129.21 |
| 4,943,486 A | 7/1990 | Uchiyama |
| 5,226,975 A | 7/1993 | Denton et al. |
| 5,370,364 A * | 12/1994 | Kenmoku et al. .......... 251/368 |
| 5,409,165 A | 4/1995 | Carroll, III et al. |
| RE34,956 E | 5/1995 | Djordjevic |
| 5,479,901 A * | 1/1996 | Gibson et al. ............... 123/472 |
| 5,492,573 A | 2/1996 | Fukushima et al. |
| 5,618,590 A | 4/1997 | Naruse et al. |
| 5,641,121 A | 6/1997 | Beck et al. |
| 5,672,386 A | 9/1997 | Ooya |
| 5,673,618 A | 10/1997 | Little |
| 5,713,333 A | 2/1998 | Cooper et al. |
| 5,773,734 A | 6/1998 | Young |
| 5,783,261 A | 7/1998 | Potter et al. |
| 5,843,571 A | 12/1998 | Sho |
| 5,851,659 A | 12/1998 | Komuro et al. |
| 5,851,680 A | 12/1998 | Heau |
| 6,089,843 A * | 7/2000 | Kondoh ...................... 251/368 |

FOREIGN PATENT DOCUMENTS

| | | |
|---|---|---|
| DE | 3624134 A1 | 1/1988 |
| DE | 4137224 C1 | 5/1993 |
| DE | 19757702 A1 | 2/1998 |
| DE | 19738351 A1 | 5/1998 |
| EP | 0 298 681 A1 | 1/1989 |
| EP | 0 818 622 A1 | 1/1998 |
| EP | 0 972 851 A2 | 1/2000 |

* cited by examiner

*Primary Examiner*—A. Michael Chambers

(57) ABSTRACT

A pressure control valve having a cage with an inlet and an outlet in fluid communication with an engine oil circuit is disclosed. The pressure control valve further has a spool in sliding engagement within the cage which blocks fluid communication between the inlet and the outlet when the spool is in the first position and places the inlet in fluid communication with the outlet when the spool is in the second position. A thin film coating is applied to an outer surface of the spool. The pressure control valve yet further has an actuator which controls movement of the spool slides from the first position to the second position. The coating reduces wear on the outer surface of the spool due to exposure of the spool to the engine oil and sliding engagement with the cage. A component of a hydraulic system is also disclosed.

5 Claims, 2 Drawing Sheets

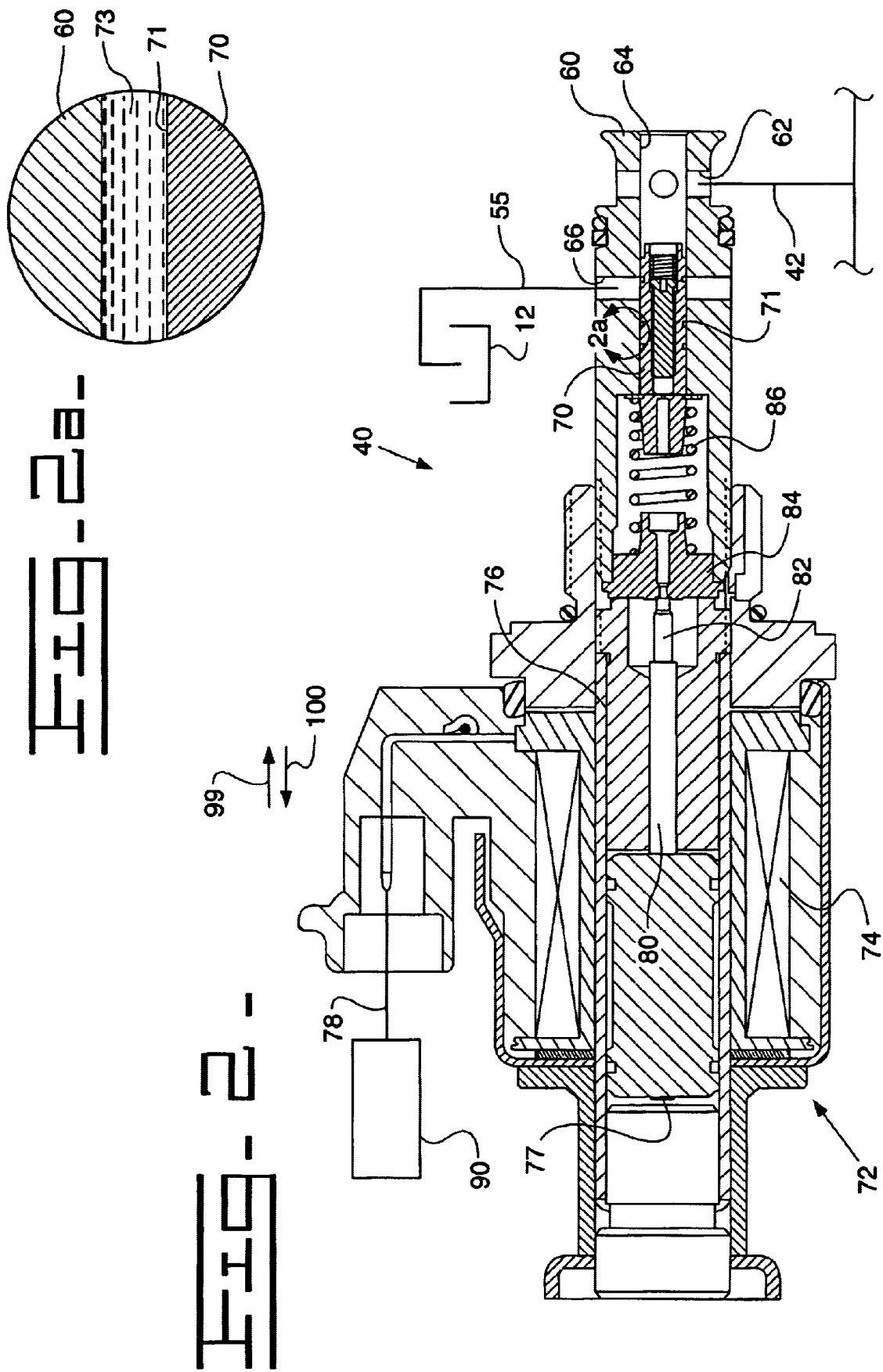

PRESSURE CONTROL VALVE HAVING ENHANCED DURABILITY

TECHNICAL FIELD OF THE INVENTION

This application is a continuation in part of Ser. No. 09/213,710 filed Dec. 17, 1998, which claims priority from Provisional Application No. 60/101,382, filed Sep. 21, 1998.

The present invention generally relates to a pressure control valve, and more specifically to a pressure control valve having enhanced durability.

BACKGROUND OF THE INVENTION

Fuel injectors, such as those used in Diesel engines require a high pressure to inject fuel into a combustion chamber of the engine. One method of pressurizing the fuel is to use a high pressure hydraulic fluid to pressurize the fuel prior to injecting the fuel into the combustion chamber. One such hydraulic fluid commonly used is an engine oil which also serves to lubricate and cool various engine components, such as pistons and valves. A drawback to using the engine oil is that the oil may become contaminated with combustion by-products making the oil both corrosive and abrasive to hydraulic components.

Additionally, modern fuel injectors require that fuel be delivered at various pressures depending on rapidly changing operating conditions of the engine. In particular, fuel pressure requirements may be varied as a result of changing engine speed, temperature, and engine load. To accommodate these changes, a pressure control valve must be used which can rapidly vary the pressure of the engine oil used to pressurize the fuel in response to the changing engine operating conditions. When the pressure control valve is exposed to the corrosive and abrasive engine oil, it is possible that the valve will wear and be unable to supply the pressurized engine oil as precisely as required. A drawback to this loss of precise pressure control is that the engine may operate at less than its' optimal operating point for a particular set of operating conditions.

What is needed therefore is a pressure control valve having enhanced durability which overcomes the above-mentioned drawbacks.

DISCLOSURE OF THE INVENTION

In accordance with a first embodiment of the present invention, there is provided a pressure control valve having a cage with an inlet and an outlet in fluid communication with an engine oil circuit. The pressure control valve further has a spool in sliding engagement within the cage which blocks fluid communication between the inlet and the outlet when the spool is in the first position and places the inlet in fluid communication with the outlet when the spool is in the second position. A thin film coating is applied to an outer surface of the spool. The pressure control valve yet further has an actuator which controls movement of the spool from the first position to the second position. The coating reduces wear on the outer surface of the spool due to exposure of the spool to the engine oil and sliding engagement with the cage.

In accordance with a second embodiment of the present invention, there is provided a component in a hydraulic system of an engine. The component includes a low alloy steel substrate and a coating on said low alloy steel substrate. The coating is selected from the group consisting of chromium nitride, zirconium nitride, molybdenum nitride, titanium-carbon-nitride, or zirconium-carbon-nitride. The said component is adapted to be exposed to a fluid within said fuel injection system and said component is further moveable within said fuel injection system relative to an adjacent component within said fuel injection system.

BRIEF DESCRIPTION OF THE DRAWINGS

FIG. 2 is a cross-sectional view of the pressure control valve of FIG. 1; and

FIG. 2A is a enlarged and dimensionally exaggerated view of a portion of the pressure control valve of FIG. 2 showing a thin film coating on a spool.

BEST MODE FOR CARRYING OUT THE INVENTION

Figure 1:
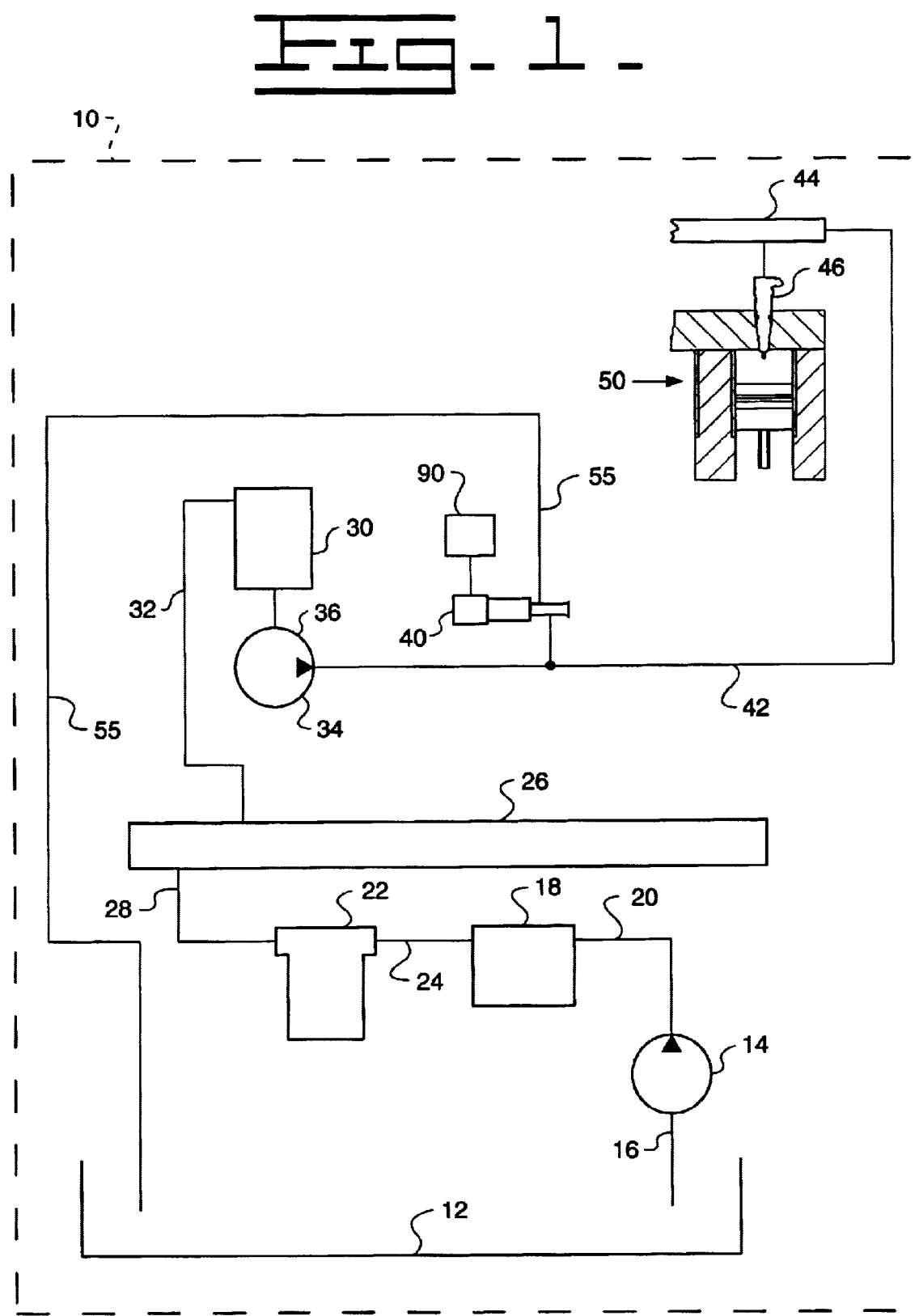
FIG. 1 is a schematic view of a hydraulic system of a diesel engine with a pressure control valve.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Referring now to FIG. 1, there is shown a schematic view a hydraulic system, or engine oil circuit, within a diesel engine 10. The diesel engine 10 includes a sump 12 for collecting low pressure oil used to lubricate and cool various components of the engine 10. Oil is drawn from the sump 12 by a low pressure pump 14 via a fluid line 16. The low pressure pump 14 then advances the oil through a cooler 18 via the line 20 where the oil is then cooled. From the cooler 18, oil advances to a filter 22 via a line 24 where contaminants are removed from the oil. The oil is then advanced to the engine oil gallery 26 via a line 28. The engine oil gallery 26 is an area within the cylinder head of the engine 10 which contains a large amount of oil for engine cooling and lubrication purposes.

From the engine oil gallery 26, oil is advanced to an oil reservoir 30 via a line 32. The oil reservoir 30 provides oil which pressurizes fuel used in the combustion process. From the oil reservoir 30, oil is advanced to the high pressure pump 34 via the line 36. The outlet of the high pressure pump 34 is in fluid communication with the pressure control valve 40 via the line 42. The line 42 is further in fluid communication with a manifold 44. The manifold 44 supplies pressurized oil to an exemplary fuel injector 46 which is used to pressurize fuel injected by the fuel injector 46 into a combustion chamber 50.

Referring now to FIG. 2, there is shown a cross-sectional view of the pressure control valve 40. The pressure control valve 40 includes a housing or cage 60 having an inlet 62 defined therein. The inlet 62 is in fluid communication with the line 42, also shown in FIG. 1. The cage 60 further has a bore 64 extending axially therethrough. The inlet 62 is further in fluid communication with the bore 64. The control valve 40 further includes an outlet 66 which is in fluid communication with the bore 64. The outlet 66 is further in fluid communication with the sump 12 via a line 55 (see FIG. 1).

A spool 70 having a low alloy steel substrate is positioned in sliding engagement within the bore 64 of the cage 60. As shown in FIG. 2, the spool 70 is placed in a first position which blocks fluid communication between the inlet 62 and the outlet 66. When the spool 70 is moved in the general direction of arrow 100, the spool 70 is placed in a second position (not shown) which places the inlet 62 in fluid communication with the outlet 66. It should be appreciated that placing the inlet 62 in fluid communication with the outlet 66 further places the inlet 62 in fluid communication with the sump 12 which lowers the hydraulic pressure in the line 42, manifold 44, and fuel injector 46.

To control the movement of spool 70, the pressure control valve 40 further includes a solenoid assembly 72. The solenoid assembly 72 includes an armature 74, a stator 76, and magnetic slug 77. As current is supplied to the armature 74 via an electric line 78, a magnetic field is created within the solenoid assembly 72 which causes the magnetic slug 77 to move to the right in the general direction of arrow 99. The force on the slug 77 engages the spool 70 via a push pin 80, poppet 82, seat 84, and spring 86. Thus, the current in the solenoid 72 produces a bias force in the general direction of arrow 99 on the spool 70 whereas the hydraulic pressure within the inlet 62 produces a bias force on the spool 70 in the general direction 100. It should be appreciated that to control the pressure in the line 42, and thus the fuel injector 46, a solenoid current can be selected such that the spool 70 slides from the first position to the second position at a desired oil pressure.

The desired oil pressure supplied to the fuel injector 46 may vary due to a number of factors such as engine speed, temperature, and engine load. These factors are fed into a controller 90, which then determines the current level supplied to the solenoid 72 via the line 78 which controls the bias force applied against the spool 70 which in turn controls the oil pressure in the inlet 62. Thus, the desired oil pressure varies constantly as these factors change. This variation, as well as the nearly constant motion of the spool 70 relative to the cage 60 to maintain the desired oil pressure, causes wear between an outer surface 71 of the spool 70 and an inner surface of the cage 60. In addition, particulate matter in the engine oil can increase the friction between the spool 70 and the cage 60 and, thus, increase abrasive wear. Moreover, as the engine oil ages, additives in the engine oil which are designed to protect metal parts become depleted and loose their ability to chemically protect metal. As wear loosens the tolerances between the spool 70 and the cage 60, it becomes more difficult to precisely control the oil pressure supplied to the fuel injector 46 with the pressure control valve 40.

Referring now to FIG. 2A, to prevent both abrasive and corrosive wear between the spool 70 and the cage 60, a wear resistant thin coating 73 is applied to the outer surface 71 of the spool 70, note the thickness of the coating 73 is exaggerated for illustration purposes. In particular, the coating 73 can be one of a number of coatings such as a Chromium Nitride (CrN), tungsten carbide carbon (WCC), or Boron Carbide ($B_4C$) preferably applied using a physical vapor deposition process. Applying a thin layer (less than 50 microns) of any of the above coatings increases the wear resistance of the metallic parts, the spool 70 and the cage 60, and also provides a protective barrier against the additive depleted engine oil which can corrosively attack the spool 70. In addition, the coated outer surface 71 is less prone to damage by contaminants in the oil which results in improved abrasive wear resistance.

INDUSTRIAL APPLICABILITY

In operation, to maintain a desired oil pressure supplied to the fuel injector 46, the controller 90 supplies a control current to the solenoid 72 which controls the force which the solenoid 72 engages the spool 70 and the oil pressure supplied to the fuel injector 46. In addition, due to varying input factors such as engine speed, engine load, temperature, and other variables; this current and bias force are constantly varying. To meet this changing oil pressure demand, the actuator 72 causes the spool 70 to slide relative to the cage 60 between the first position which blocks fluid communication between the inlet 62 and the outlet 66 and the second positions which places the inlet 62 in fluid communication with the outlet 66 thereby reducing the oil pressure in the line 42, manifold 44, and fuel injector 46. Thus, the outer surface 71 of the spool 70 is in a state of constant sliding engagement with the inner surface of the cage 60 which causes wear between the two components.

To prevent this wear between the spool 70 and the cage 60, a coating 73 such as a Chromium Nitride (CrN), Tungsten Carbide carbon (WCC), or Boron Carbide ($B_4C$) is applied to the outer surface 71 of the spool 70 by a physical vapor deposition process. Typically, less than 50 microns thickness of coating 73 is sufficient to increases the wear resistance of the metallic spool 70 and the cage 60. The coating 73 also provides a protective barrier against the additive depleted engine oil and makes the coated surface less prone to damage or wear as a result of contaminants in the oil.

While the invention has been illustrated and described in detail in the drawings and foregoing description, such illustration and description is to be considered as exemplary and not restrictive in character, it being understood that only the preferred embodiment has been shown and described and that all changes and modifications that come within the spirit of the invention are desired to be protected.

What is claimed is:

1. A component of a hydraulic system in an engine comprising:
    a low alloy steel substrate;
    a coating on said low alloy steel substrate, said coating selected from the group consisting of chromium nitride, tungsten carbide carbon, or Boron Carbide;
    wherein the component is adapted to be exposed to a fluid within the hydraulic system and the component is further moveable within the hydraulic system relative to an adjacent component within the hydraulic system.

2. The component of claim 1, wherein the coating has a thickness of less than fifty microns.

3. The component of claim 1, wherein the fluid is an engine oil.

4. The component of claim 1, wherein the component is a spool in a pressure control valve.

5. The component of claim 4, wherein the adjacent component is a cage of a pressure control valve.

* * * * *